United States Patent [19]

Mozer

[11] Patent Number: 4,955,036
[45] Date of Patent: Sep. 4, 1990

[54] SEMICONDUCTOR ARRANGEMENT FOR PRODUCING A PERIODIC REFRACTIVE INDEX DISTRIBUTION AND/OR A PERIODIC GAIN DISTRIBUTION

[75] Inventor: Albrecht Mozer, Bietigheim-Bissingen, Fed. Rep. of Germany

[73] Assignee: Alcatel N.V., Amsterdam, Netherlands

[21] Appl. No.: 324,682

[22] Filed: Mar. 17, 1989

[30] Foreign Application Priority Data

Mar. 17, 1988 [DE] Fed. Rep. of Germany ....... 3808875

[51] Int. Cl.$^5$ .............................................. H01S 3/08
[52] U.S. Cl. .................................. 372/96; 372/45; 372/46; 372/68
[58] Field of Search .................. 372/43, 46, 96, 45, 372/68

[56] References Cited

FOREIGN PATENT DOCUMENTS

| | | |
|---|---|---|
| 0149462 | 7/1985 | European Pat. Off. . |
| 0177221 | 4/1986 | European Pat. Off. . |
| 0213965 | 3/1987 | European Pat. Off. . |
| 6016080 | 8/1985 | Japan . |
| 61-251183 | 11/1986 | Japan ................................... 372/96 |

OTHER PUBLICATIONS

Patent Abstracts of Japan, Appl. No. 56-15954, vol. 6, No. 230 (E-142) [1108], Nov. 16, 1982.
Patent Abstracts of Japan, Appl. No. 59-15166, vol. 9, No. 328 (E-369) [2051], Dec. 24, 1985.
Patent Abstracts of Japan, Appl. No. 58-27177, vol. 8, No. 285 (E-287) [1722], Dec. 26, 1984.
Patent Abstracts of Japan, Appl. No. 57-107818, vol. 8, No. 78 (E-237) [1515], Apr. 10, 1984.
Patent Abstracts of Japan, Appl. No. 55-67917, vol. 6, No. 52 (E-100) [930], Apr. 7, 1982.
Patent Abstracts of Japan, Appl. No. 57-148126, vol. 8, No. 127 (E-250) [1564], Jun. 14, 1984.
Patent Abstracts of Japan, Appl. No. 58-198316, vol. 9, No. 240 (E-345) [1963], Sep. 26, 1985.

*Primary Examiner*—William L. Sikes
*Assistant Examiner*—Georgia Y. Epps
*Attorney, Agent, or Firm*—Spencer & Frank

[57] ABSTRACT

A device for the amplification of light including a periodic semiconductor structure composed of different layers extending in the propagation direction of the optical wave. The periodic structure is constructed of a series connection of at least two semiconductor materials having the band gaps E1 and E2 and the refractive indices n1 and n2 (e.g., E1<E2, n1>n2), can be operated as follows:
as a passive interference filter;
as an active, partially amplifying interference filter;
as a narrow band optical amplifier;
as a single-mode laser which emits only a single mode.

14 Claims, 3 Drawing Sheets

SEMICONDUCTOR ARRANGEMENT FOR PRODUCING A PERIODIC REFRACTIVE INDEX DISTRIBUTION AND/OR A PERIODIC GAIN DISTRIBUTION

CROSS REFERENCE TO RELATED APPLICATION

This application claims the priority of application Ser. No. P 38 08 875.4, filed Mar. 17, 1988, in the Federal Republic of Germany, the subject matter of which is incorporated herein by reference.

BACKGROUND OF THE INVENTION

The invention relates to optical semiconductor transmitters or semiconductor amplifiers having a periodic structure.

The transmission of communications via optical fibers permits very high data rates. Due to the dispersion behavior of optical fibers, the transmission of communications over long distances requires lasers which emit a single longitudinal mode. EP-A 0,149,462 discloses that it is possible, by integrating a diffraction grating in a semiconductor laser so as to reduce the number of modes emitted by the laser. Such lasers are called DFB (distributed feedback) lasers. It can be demonstrated that even a DFB laser emits in two longitudinal modes which is not the optimum with a view toward the conversion of electrical energy to radiation energy.

Moreover, EP-A 0,213,965 discloses the connection of an semiconductor laser with a tunable resonator to thus realize a reduction in the number of longitudinal modes. The resonator disclosed in this publication also includes a diffraction grating so that, with this solution as well, two longitudinal modes are emitted in principle.

SUMMARY OF THE INVENTION

It is an object of the invention to construct an optical semiconductor transmitter or semiconductor amplifier in such a manner that it amplifies only a single mode and thus permits the emission of a single mode. This is accomplished by a device for the amplification of light including the a periodic succession of different semiconductor layers extending in the propagation direction of the optical wave. The dependent claims define modifications and features of the semiconductor transmitter or semiconductor amplifier.

The arrangement according to the invention has the advantage that it can be used universally for the most varied applications in optical data transmission. This arrangement can be employed as:

1. a passive interference filter;
2. an active, tunable bandwidth interference filter;
3. an active, single longitudinal mode transmitting laser.

BRIEF DESCRIPTION OF THE DRAWINGS

Several embodiments of the invention will now be described and explained in greater detail with reference to FIGS. 1 to 5 wherein.

DESCRIPTION OF THE PREFERRED EMBODIMENTS

Figure 1A:
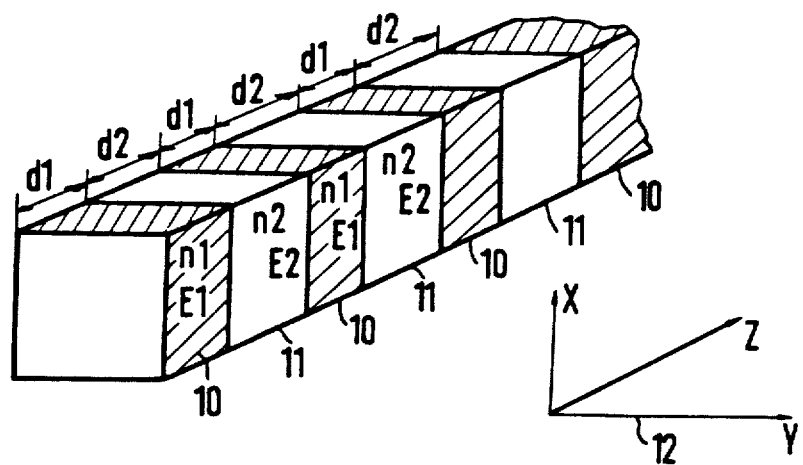
FIG. 1a shows the basic structure of the semiconductor amplifier or semiconductor laser according to the invention.
Figure 1B:
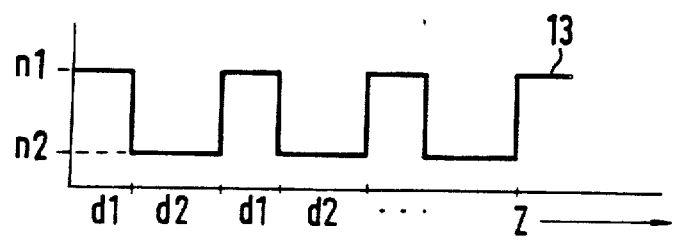
FIG. 1b shows curves of the refractive indices and of the band gaps of such an arrangement.

FIG. 1a shows the basic structure of the optical semiconductor laser or semiconductor amplifier. The numeral 10 identifies a layer composed of a first semiconductor material having a refractive index n1 and a band gap E1. The numeral 11 identifies a second layer having a refractive index n2 and a band gap E2. As can be seen in FIG. 1a, the layer sequence composed of the two layers 10 and 11 is repeated several times. The thicknesses of the individual layers are marked d1 and d2. They vary depending on the particular application. The numeral 12 identifies a coordinate system which is to indicate the spatial position of the semiconductor arrangement. The propagation direction of the light processed by the amplifier or the propagation direction of the light during laser operation is the z direction. In the upper diagram of FIG. 1b, the numeral 13 identifies the curve of the refractive index in the z direction of the semiconductor arrangement of FIG. 1a. In the diagram below it, the numeral 14 indicates the curve of the band gap in the z direction. In the selected embodiment, the material having the smaller band gap E1 has the greater refractive index n1. The reverse case can also be realized.

Figure 1B:
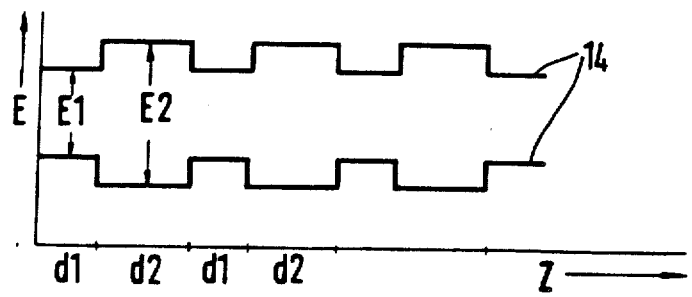

In principle, a layer sequence is also conceivable which is composed of more than two different semiconductor materials. In FIG. 1 materials having refractive indices n1 to nj and band gaps E1 to Ej would then have to be provided. The embodiments to be described below are composed of only two different semiconductor materials. A structure according to FIG. 1a can be produced, for example, with the aid of the materials $Ga_xIn_{1-x}As_yP_{1-y}$ and InP. For the firstmentioned material, the band gap can be varied depending on its composition; here a band gap E1 of 1.0 eV is selected with a refractive index n1 of 3.4. The second selected material Inp has a band gap E2 of 1.35 eV and a refractive index n2 of 3.2. In principle, other systems of materials can also be employed without loss of the function principle.

Figure 2A:
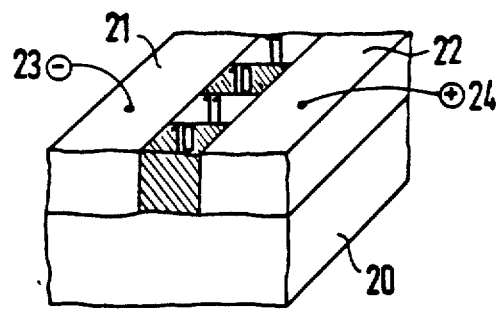
FIG. 2a shows a first embodiment according to the invention.
Figure 2B:
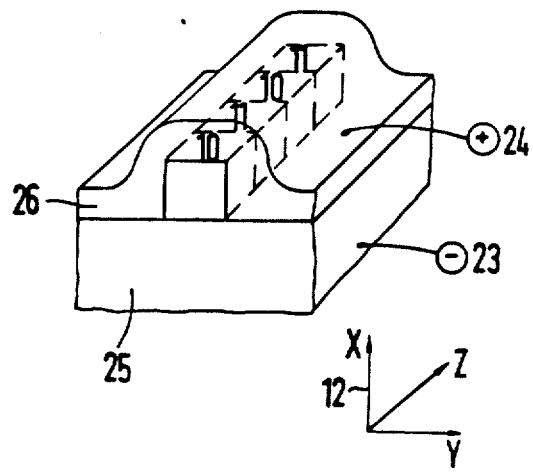
FIG. 2b shows a second embodiment.
Figure 2C:
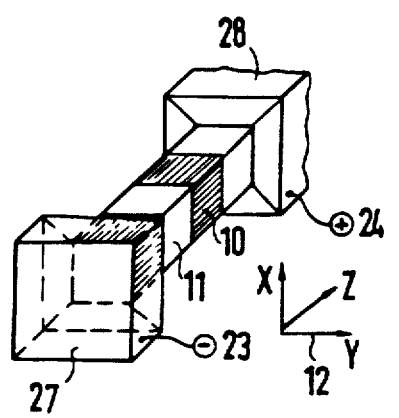
FIG. 2c shows a third embodiment.

FIG. 1 so far has illustrated exclusively the basic structure of the successive layers. FIG. 2 shows three embodiments which relate to the embedment of the layer sequence of FIG. 1 in an semiconductor component. In FIG. 2a, the numeral 20 identifies a semi-insulating substrate, the numeral 21 an n-type semiconductor, in the selected example advantageously n-InP and the numeral 22 a p-type semiconductor (advantageously p-InP). The numerals 23 and 24 identify contacts which supply the two semiconductors 21 and 22 with current. The laser or optical amplifier of FIG. 1a is embedded between semiconductors 21 and 22. As in FIG. 1a, the layer sequence is identified by the numerals 10 and 11. Here again, the coordinate system marked 12 indicates the spatial position of the semiconductor arrangement. FIG. 2b shows a further embodiment in which the laser or optical amplifier is disposed on an n-type semiconductor (e.g. n-InP) marked 25. The thus produced arrangement is embedded in a p-type semiconductor (e.g. p-InP). As in FIG. 2a, the numerals 23 and 24 identify the current supply. The spatial position of the arrangement is indicated by coordinate system 12. FIG. 2c shows a third embodiment of the semiconductor laser or semiconductor amplifier. The layer sequence composed of the two layers 10 and 11 is here embedded at its frontal faces in an n-type semiconductor 27 (e.g. n-InP) and a p-type semiconductor 28 (e.g. p-InP). Contacts 23 and 24 serve as current supplies. As in FIGS. 2a and 2b, the spatial position is indicated by coordinate system 12.

If an external voltage is applied to the illustrated structures with the polarity as shown, the injected charge carriers collect in the semiconductor region having the smaller band gap, here marked E1. In this way, a spatially periodic gain distribution as well as a periodic refractive index distribution is realized along the z axis. These different periodicities can be employed to advantage for various types of components; such components are, for example,
1. passive interference filters;
2. active interference filters that amplify over a narrow band;
3. narrow-band optical repeaters;
4. single-mode transmitting lasers.

Figure 3:
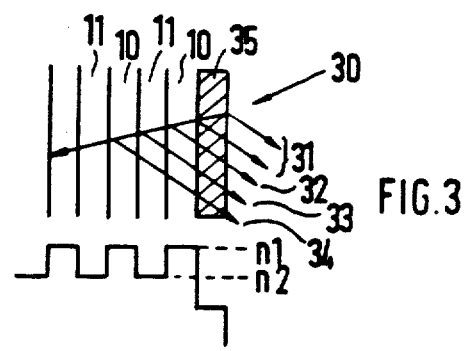
FIG. 3 illustrates the principle of a passive or an active interference filter.
Figure 4:
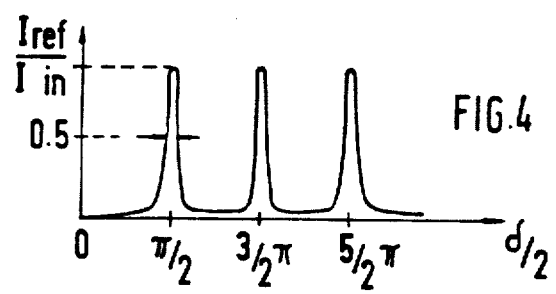
FIG. 4 illustrates the ratio of incident intensity to reflected intensity in an interference filter.

The physical operation of this semiconductor structure as a passive interference filter is shown in FIGS. 3 and 4 and the relevant mathematical equations are listed below.

The physical operation of this semiconductor structure as an active interference filter or narrow-band amplifier will now be described briefly. If the semiconductor structure is pumped (current injection) and if the energy of the incident light ray lies between that of the two band gaps E1 and E2, the incoming light is still amplified in the regions of E1. The basic operation is similar to the case of a structure that is not pumped, i.e. a passive interference filter.

Figure 5:
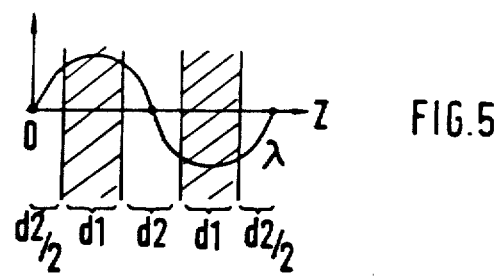
FIG. 5 illustrates the amplification of a single longitudinal mode in such a successive structure.

With the aid of FIG. 5, a further type of use for the illustrated semiconductor arrangement becomes evident, namely for the production of a single-mode emission. In this case, it is essentially the spatially periodic gain distribution that is utilized. Due to the periodic structure and the periodic distribution of the amplification, a distribution is forced onto the radiation in the semiconductor which leads to single-mode emission. For this purpose, the semiconductor structure is pumped to beyond the laser threshold, causing standing waves to be formed in the semiconductor. These standing waves are amplified in the oscillation antinodes but not in the oscillation nodes. In this way, only a single oscillation mode is generated over the entire length which then leads to single-mode emission. Thus, the structure constitutes a mono-mode laser which oscillates in only a single mode and not, as the DFB lasers employed in the past, principally in two modes. This eliminates the problem of a λ/4 phase matching region which must be provided in the conventional DFB lasers to realize single-mode operation.

Let it be assumed that a light ray marked 30 impinges from the right onto the arrangement of FIG. 3. The energy of the photons of light ray 30 is assumed to be less than the band gap $E_1$ (only in the case of a passive interference filter). A λ/4 anti-reflection layer is marked 35. This anti-reflection layer is followed by the known layers 10 and 11, several times in succession. The rays 31 reflected at the λ/4 layer cancel one another out due to interference. The reflected light is composed of the rays marked 32, 33, 34, . . . . For reasons of clarity, no illustration is given of further reflected rays. The following applies for the light wave $\psi_{ref}$ reflected at the periodic structure:

$$\psi_{ref} = \sum_{i=1}^{\infty} \psi_i$$

In a first approximation, the following applies for the reflected intensity:

$$I_{ref} \approx \frac{I_{in}}{(2-r)^2 - 4(1-r)\sin^2(\delta/2)} \quad (1)$$

In equation (1), r is the reflection coefficient of the electrical field, expressed as follows:

$$r = \left| \frac{n1 - n2}{n1 + n2} \right|$$

δ is the phase shift between adjacent partial waves. Equation (1) reaches maxima for the following values of δ/2:

$$\frac{\delta}{2} = \frac{\pi}{2}, \frac{3\pi}{2}, \frac{5\pi}{2} \cdots$$

Thus, the layer thicknesses of d1 and d2 are calculated as follows:

$$d1 = \frac{\lambda}{n1}\left(\frac{1}{4}, \frac{3}{4}, \frac{5}{4} \cdots\right) \text{ and}$$

$$d2 = \frac{\lambda}{n2}\left(\frac{1}{4}, \frac{3}{4}, \frac{5}{4} \cdots\right)$$

For these values of d1 and 2, constructive interference occurs. λ is here the emission wavelength of the incident light beam 30.

In FIG. 4, the reflected intensity of Equation (1) is plotted as a function of the phase shift δ.

Thus, one is able to construct an interference filter of semiconductors in which the effective wavelength (maximum reflection in the filter) can be set as desired by way of the thicknesses d1 and d2 and whose half-width can also be set as desired, within wide limits, by selection of the reflection amplitude coefficient r or, respectively, by selection of the refractive indices n1 and n2.

The considerations above are generally applicable for any desired emission wavelengths λ of the incident light ray and for a semiconductor structure that is not pumped.

It will be understood that the above description of the present invention is susceptible to various modifications, changes and adaptations, and the same are intended to be comprehended within the meaning and range of equivalents of the appended claims.

What is claimed is:

1. In a semiconductor device for the amplification of light, said device having a given direction of propagation of an optical wave and including a sequence of semiconductor material layers disposed between a layer of n-type semiconductor material and a layer of p-type semiconductor material, and respective electrodes for said n-type and p-type layers, the improvement wherein: said sequence of semiconductor material layers comprises a periodic succession of layers of at least two different semiconductor materials with said succession of layers extending in said given direction of propagation of the optical wave, and with said semiconductor material of successive layers of said periodic succession having different refractive indices and different band gaps.

2. A device as defined in claim 1, wherein said periodic succession consists of layers of two different semiconductor materials, with one of said two semiconductor materials having a smaller band gap and a larger refractive index than the other of said two semiconductor materials.

3. A device as defined in claim 2, wherein at least one of said two semiconductor materials is composed of one of a ternary and a quaternary mixed crystal.

4. A device as defined in claim 2, wherein the layers composed of the semiconductor material having the smaller band gap are pumped electrically.

5. A device as defined in claim 4, wherein said periodic succession of layers of different semiconductor materials is applied to a surface of a semi-insulating substrate and is surrounded at its respective long sides by said p-type and said n-type semiconductor material layers which are likewise applied to said surface of said substrate.

6. A device as defined in claim 4, wherein said periodic succession of layers of different semiconductor materials is applied to said n-type semiconductor material layer and is embedded in said layer of p-type semiconductor material.

7. A device as defined in claim 4, wherein said periodic succession of layers of different semiconductor materials is delimited at one frontal face by said n-type semiconductor material layer and at the other front face by said p-type semiconductor material layer.

8. A device as defined in claim 2, wherein said device amplifies respective light having a photon energy which lies between the two respective band gaps of the two different semiconductor materials.

9. A device as defined in claim 8, wherein said device is one of
a passive interference filter and an active, partially amplifying interference filter.

10. A device as defined in claim 8, wherein said device is a narrow band optical amplifier.

11. A device as defined in claim 8, wherein said device is a laser for the generation of light in a single oscillation mode.

12. A device as defined in claim 8, wherein said device is a repeater for an optical transmission path.

13. A device as defined in claim 2 wherein said two different semiconductor materials are InP and $Ga_xIn_{1-x}As_yP_{1-y}$.

14. A device as defined in claim 13 wherein said n-type and p-type semiconductor layers are InP.

* * * * *